(12) United States Patent
Le Neel et al.

(10) Patent No.: US 9,651,627 B2
(45) Date of Patent: May 16, 2017

(54) ACCUMULATED POWER CONSUMPTION SENSOR: APPLICATION IN SMART BATTERIES SYSTEMS

(71) Applicant: STMicroelectronics Pte Ltd., Singapore (SG)

(72) Inventors: Olivier Le Neel, Singapore (SG); Calvin Leung, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 711 days.

(21) Appl. No.: 13/853,666

(22) Filed: Mar. 29, 2013

(65) Prior Publication Data

US 2014/0292344 A1 Oct. 2, 2014

(51) Int. Cl.
*H02J 7/00* (2006.01)
*H02J 7/14* (2006.01)
*G01R 31/36* (2006.01)

(52) U.S. Cl.
CPC ........ *G01R 31/3679* (2013.01); *H02J 7/0021* (2013.01); *G01R 31/3662* (2013.01); *H02J 7/0006* (2013.01); *H02J 7/0016* (2013.01); *H02J 7/0036* (2013.01)

(58) Field of Classification Search
USPC ....... 324/425, 426, 427, 428, 429, 430, 431, 324/432, 433; 320/134, 132, 112, 136, 320/162, 116, 126, 103, 104, 107, 124, 320/127, 128, 137, 167, 125, 135, 152, 320/153
See application file for complete search history.

(56) References Cited

U.S. PATENT DOCUMENTS

| 2012/0112700 A1* | 5/2012 | Morimoto | H02J 7/0072 320/132 |
| 2012/0245872 A1* | 9/2012 | Sheng | G01R 31/3631 702/65 |

* cited by examiner

*Primary Examiner* — Alexis A Boateng
(74) *Attorney, Agent, or Firm* — Seed Intellectual Property Law Group LLP

(57) ABSTRACT

A device is provided for monitoring the total current discharged from a battery. The device includes a bridge circuit of resistors in which one of the resistors has a resistance which varies according to the current which has passed through it. Whenever the battery passes a current to a load, a small portion of the current is passed through the bridge circuit.

21 Claims, 9 Drawing Sheets

ACCUMULATED POWER CONSUMPTION SENSOR: APPLICATION IN SMART BATTERIES SYSTEMS

BACKGROUND

Technical Field

The present disclosure relates to the field of electronic devices powered by batteries. The present disclosure relates more particularly to the field of monitoring the life of a battery.

Description of the Related Art

Batteries are included in nearly every kind of portable electronic device. Most portable electronic devices include rechargeable batteries which, upon being depleted of their charge, can be recharged so that they may be used again.

However, rechargeable batteries cannot be recharged a limitless number of times. After a rechargeable battery goes through many cycles of discharging and charging, the rechargeable battery begins to hold less charge upon being recharged.

As the battery continues to be charged and discharged, eventually the battery holds so small a charge that it is no longer useful. Not only does the battery store less charge, but the maximum voltage between the terminals of the charged battery also become smaller over time. Eventually the battery voltage becomes so small that it can no longer effectively power the portable electronic device even for a short time.

BRIEF SUMMARY

One embodiment is a smart battery configured to supply power to a portable electronic device. The smart battery includes a rechargeable battery cell and a battery life sensor. The battery life sensor is coupled to the rechargeable battery cell and configured to provide an indication of the remaining life cycle of the rechargeable battery cell.

In one embodiment when the smart battery provides power to the portable electronic device, the battery also provides power to the battery life sensor. Thus, each time the smart battery provides power to the portable electronic device, the battery life sensor receives an electrical signal indicating that the rechargeable battery cell is discharging. The battery life sensor can provide an indication of the total accumulated power discharged from the rechargeable battery cell during the life of the rechargeable battery cell. For a battery that has discharged so much power that the end of its useful life cycle is approaching, the battery life sensor can provide an indication that the rechargeable battery cell needs to be replaced.

In one embodiment the battery life sensor includes an adjustable resistor whose resistance permanently changes as current passes therethrough. When the smart battery supplies current to the portable electronic device, the battery cell passes a smaller current through the adjustable resistor. While the battery cell is passing current to the adjustable resistor, the resistance of the adjustable resistor gradually changes. The resistance of the adjustable resistor gives an indication of how much power has been dissipated, or how much current has been discharged, by the rechargeable battery cell during its lifetime. Thus, taking a measurement of the resistance of the adjustable resistor provides an indication of the total discharge from the rechargeable battery cell. By knowing the total discharge from the rechargeable battery cell, the remaining life cycle of the rechargeable battery cell can be estimated.

In one embodiment the smart battery provides a sensor output signal to an analog-to-digital converter. The sensor output signal is an analog signal indicative of the total discharge from the rechargeable battery cell over its lifetime of use. The analog-to-digital converter converts the sensor output signal to a digital value. The digital value gives a digital indication of the total discharge from the rechargeable battery cell.

Portable devices are not limited to small, handheld products. A battery powered car is a portable device, as is an airplane if the battery is used as a primary power source for equipment and it must be recharged frequently as the product is used and the power is depleted. One embodiment of the present invention can monitor the total current discharged from a car battery or an airplane battery of its lifetime of service and provide an output signal that indicates how much total life remains for the battery.

DETAILED DESCRIPTION

Figure 1:
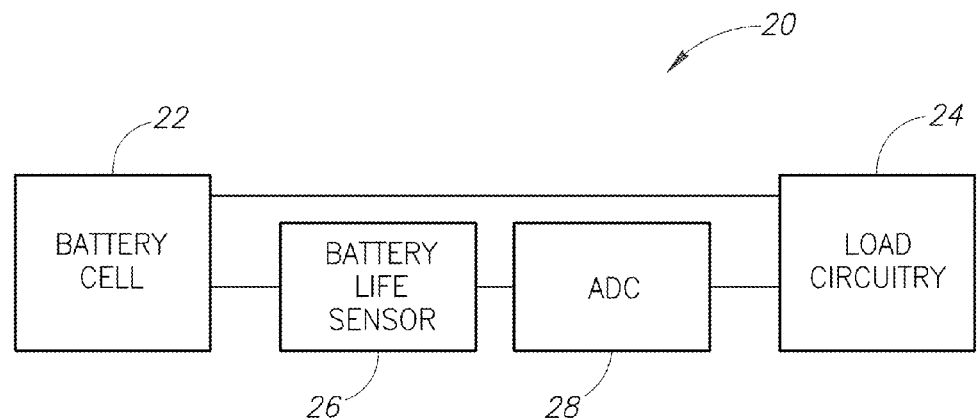
FIG. 1 is a block diagram of a portable electronic device including a battery life sensor according to one embodiment.

FIG. 1 is a block diagram of an electronic device 20 according to one embodiment. The electronic device 20 includes a battery cell 22 coupled to load circuitry 24 and battery life sensor 26. An analog-to-digital converter/controller 28 is coupled to the battery life sensor 26 and the load circuitry 24.

The battery cell 22 is a rechargeable battery cell. When the electronic device 20 is in use, the battery cell 22 provides power to the load circuitry 24. Current passes from the battery cell 22 through the load circuitry 24. The load circuitry 24 performs its functions using power from the battery cell 22.

After providing power to the load circuitry 24 for some amount of time, the battery cell 22 is depleted of its charge and must be recharged in order to provide power to the load circuitry 24 again. After the battery cell 22 has been recharged, the battery cell 22 can again provide power to the load circuitry 24. It might be used for a short period and then charged again before it has been fully discharged. Each time the battery cell 22 is depleted of its charge, it must be recharged in order to provide power to the load circuitry 24 again.

However, the battery cell 22 can only be discharged and recharged a finite number of times before it becomes unable to hold a useful charge again. With each cycle of discharging and recharging, the battery cell 22 gradually begins to hold a smaller charge. After many cycles of charging and discharging, eventually the battery cell 22 holds so little charge, that it can no longer effectively power the load circuitry 24 and must be replaced.

It is useful to have a gauge of how near the battery cell 22 is to the end of its useful life cycle so that it may be replaced or discarded before it fails. In one embodiment, the battery life sensor 26 provides an indication of the total discharge of current that has passed from the battery cell 22 over the course of the lifetime of the battery cell 22.

In one embodiment, the battery life sensor 26 is configured to receive a sensor current from the battery cell 22 whenever the battery cell 22 provides a load current to the load circuitry 24. When the electronic device 20 is in use, the battery cell 22 provides a load current to the load circuitry 24, and at the same time, a sensor current to the battery life sensor 26. The battery life sensor 26 measures the total accumulated current that has passed through the battery life sensor 26. The sensor current is made proportional to the load current according to a known relationship, so this will provide an indication of the amount of current that has passed through the load.

When the electronic device 20 is in use, the load circuitry 24 receives the load current and the battery life sensor 26 receives the sensor current. Because of the known relationship between the equivalent resistance of the load circuitry 24 and the equivalent resistance of the battery life sensor 26, the relationship between the sensor current and the load current can also be known.

The load circuitry 24 of the electronic device 20 may include many electronic components such as multiple integrated circuit packages, resistors, capacitors, or other types of circuit components. The many components of the load circuitry 24 can be modeled as a single equivalent resistor having a particular resistance. The battery life sensor 26 also has a total resistance that can be modeled as its equivalent resistance.

In one embodiment the equivalent resistance of the load is about 10Ω. The equivalent resistance of the battery life sensor 26 is about 10 kΩ. In other embodiments, the battery life sensor is above 1 MO and might be between 1Ω-100Ω. Because the equivalent resistance of the battery life sensor 26 is much larger than the equivalent resistance of the load, the sensor current is much smaller than the load current. In particular, for a given voltage of the battery cell 22, the sensor current is about $\frac{1}{1000}$ the load current or in some cases $\frac{1}{100,000}$ the load current. Therefore, the power dissipated by the battery life sensor 26 is about $\frac{1}{1000}$ or $\frac{1}{10,000}$ the power dissipated by the load. This means that the battery life sensor 26 is not a significant power drain on the battery cell 22. The battery life sensor 26 can therefore be implemented in an electronic device 20 with very little impact on the length of time that the electronic device 20 can be powered by the battery cell 22 on a single charge.

The battery life sensor 26 provides a measurement of the total amount of current that has flowed through the battery life sensor 26 over the total lifetime of the battery cell 22. Because the sensor current has a known relationship with the load current, the total load current that has passed through the load during the lifetime of the battery cell 22 can also be known. Thus, the total current discharged from the battery cell 22 can be measured by the battery life sensor 26. The power P dissipated by the battery cell 22 while providing a total current I is given by the well-known relationship:

$$P=I*V,$$

where V is the voltage across the terminals of the battery cell 22. In other words the power dissipated by the battery cell 22 is the product of the current passing from the battery cell 22 and the voltage across the terminals of the battery cell 22. Thus, by measuring the total current that has passed through the battery life sensor 26, the total power dissipated across the battery life sensor 26 is known. Because of the known relationship between the sensor current and the load current, the total power dissipated across the load circuitry 24 is also known. The total power dissipated by the battery cell 22 is the sum of the power dissipated across the load circuitry 24 and the power dissipated across the battery life sensor 26. The battery life sensor 26 provides an output signal which is an indication of the total accumulated discharge of the battery cell 22 during the lifetime of the battery cell 22.

The analog-to-digital converter/controller 28 is coupled to the battery life sensor 26 and receives the output signal from the battery life sensor 26. The analog-to-digital converter 28 converts the output signal from the battery life sensor 26 to a digital signal. The digital signal is passed to control circuitry which can be part of the analog-to-digital converter module 28, or can be included in the load circuitry 24. The control circuitry processes the digital signal output by the analog-to-digital converter 28 and calculates the estimated remaining battery life of the battery cell 22.

The control circuitry can estimate the remaining battery life of the battery cell 22 by comparing the digital signal received from the analog-to-digital converter 28 to values stored in a memory. The memory can be part of the control circuitry, and/or can be included in the load circuitry 24. The memory can store tables of values of the digital signal and corresponding values of remaining battery life of the battery cell 22. Alternatively, the control circuitry can execute software which includes mathematical equations, data, or relationships for calculating or estimating the remaining battery life of the battery cell 22.

In one embodiment the control circuitry is configured to output an alert when the remaining battery life is less than a threshold value. The alert can be output as an audio or visual signal from the electronic device 20. Alternatively, the alert can be transmitted to other devices by using wireless transmission circuitry included an electronic device 20. The alert can include a reminder to replace the battery cell 22 or discard the battery cell 22. In some devices the battery cell 22 cannot be easily replaced. In this case, the alert can include a reminder to replace the electronic device 20 or to send the electronic device 20 to the manufacturer for battery replacement.

In one embodiment, the battery cell 22 is a lithium-ion battery. Alternatively, the battery cell 22 can be a Nickel-Zinc battery, Nickel-Cadmium batteries, Nickel-metal-hydride battery, a Zinc-Magnesium oxide battery, a Lead-acid battery, or any other kind of battery that provides power to electronic device. While the battery cell 22 has been described as a single battery, the battery cell 22 can include multiple individual batteries connected in series, in parallel, or groups of batteries having both series and parallel connections.

The battery life sensor 26 can include any suitable sensing device which can detect discharge of the battery cell 22. In one example, the battery life sensor 26 includes a component having a characteristic or attribute which changes when a current is passed therethrough. The component can include a resistor having a resistance which changes as current flows through it. Alternatively, the battery life sensor 26 can include processing circuitry configured to count or monitor the total length of time during which current has flowed, the total current discharge, or the total power dissipation from the battery cell 22.

In one embodiment, the battery life sensor 26 is also configured to monitor the charging cycles of the battery cell 22. For example, when the battery cell 22 is recharged by a recharging device, the recharging device passes a recharging current to the battery cell 22. The battery life sensor 26 can also contain circuits to receive a current proportional to the recharging current. Thus, by monitoring the current provided to the battery life sensor 26 during recharging cycles of the battery cell 22, the battery life sensor 26 can provide an indication of both the total charge current and also discharge current from the battery cell 22 during the life of the battery cell 22.

In one embodiment, the analog-to-digital converter 28 includes a microcontroller implemented in the same integrated circuit die or integrated circuit package as the analog-to-digital converter 28. Additionally, the battery life sensor 26 can be implemented in the same integrated circuit die or integrated circuit package as the analog-to-digital converter 28. Alternatively, the battery life sensor 26 can provide a digital output signal without an analog-to-digital converter 28.

For some electronic devices 20 it is very important that the device not fail at any time. Examples of such devices include medical devices such as pacemakers, defibrillators, and other medical devices that are powered by batteries. In such devices, when the battery life sensor 26 indicates that the remaining lifetime of the battery cell 22 is low, a signal can be output from the electronic device 20 which indicates to the user that the battery or the entire electronic device 20 needs to be replaced. Additionally, the electronic device 20 can transmit a signal to a doctor office or other medical database indicating that the remaining battery life of the electronic device 20 is low and that the patient should be seen immediately.

The electronic device 20 can be also be any other kind of electronic device that is powered by battery. For example, the electronic device 20 can be a smartphone, a tablet, a laptop computer, an MP3 player, a gaming device, a PDA, a GPS device, or any other suitable electronic device. It can also be a larger device, such as an electric car or airplane.

The load circuitry 24 can include any or all of the electronic components included in the electronic device 20. For example, a smartphone contains many electronic components all powered by a battery cell 22. The circuitry in the smartphone can include multiple wireless transmitters and receivers, an LCD display, and multiple types of memory including SRAM, DRAM, flash RAM, and other EEPROM. The smartphone can include multiple digital signal processing circuits, microcontrollers, resistors capacitors and many other kinds of circuits. All of these are included in the load circuitry 24. In other words, the load circuitry 24 can include many circuit components including a dozen or more integrated circuit packages. In practice, a smartphone can include many other circuit components aside from, or in addition to, those described above.

While the load circuitry 24 is shown as a separate component from the analog-to-digital converter 28 in FIG. 1, in practice the analog-to-digital converter 28 may be included in the load circuitry 24. For example, many electronic devices already include an analog-to-digital converter and controller among the load circuitry 24. The battery life sensor 26 can pass an analog output signal to an analog-to-digital converter 28 already included in the load circuitry 24. The same processor which runs the user applications for the phone can run this as one or more applications. Accordingly, in some embodiments, the battery life sensor 26 can be implemented in existing electronic devices with very minor modification to the electronic devices.

The electronic device 20 can also be an electronic device which is not powered by a battery. Instead, the electronic device 20 can receive power from a power outlet, by near field communication, or in any other suitable manner. In these cases the battery life sensor 26 can be utilized to sense the lifetime of one or more components of the load circuitry 24.

Electronic components typically have a lifetime which can be measured in usage hours, days, or years. Manufacturers of electronic components often provide a predicted lifetime of the electronic components. Because the battery life sensor can sense when a current is passed to the load circuitry 24, the battery life sensor 26 can also be used to sense the remaining lifecycle of one or more electronic components of the load circuitry 24.

In this case, the battery life sensor 26 is not a battery life sensor but an electronic component life sensor. As described above, the battery life sensor 26 can provide an indication of the total power dissipated by the load circuitry 24. From this information, the remaining lifecycle of the load circuitry 24 can be estimated and calculated in the same way as described above in relation to the battery cell 22. In particular, whenever the load circuitry 24 receives power, the sensor 26 also receives power. The sensor 26 can measure the accumulated power dissipation in the load circuitry 24. The analog-to-digital converter 28 and the control circuitry described previously can provide an estimation or calculation of the remaining lifetime of the electronic component based on the accumulated power dissipation as sensed by the sensor 26. An alert can be provided indicating that the load circuitry 24 or some portion thereof should be replaced are serviced in a similar manner as described above in relation to the battery cell 22.

To aid in understanding the function of a battery life sensor 26 according one embodiment, an analogy to automobiles may be beneficial. The fuel gauge of an automobile gives an indication of how much fuel is currently stored in the fuel tank. The amount of fuel stored in the fuel tank is an indication of how many miles the automobile may be driven before the fuel tank must be refilled. The amount of fuel stored in the fuel tank does not give an indication of the remaining lifetime of the automobile. Instead, the automobile has an odometer which measures the total number of miles the car has driven. Some trucks and tractors have an hour run gauge that shows how many hours the engine has been running as an accumulated total over its lifetime. The hours meter runs whenever the engine is on, even in idle going nowhere. The total number of miles the car has driven or hours the engine has run is a better indication of the remaining lifetime of the automobile. In one embodiment, the battery life sensor 26 is similar to the odometer of an automobile in that it gives an indication of the total usage of the battery cell 22 during the lifetime of the electronic device 20 as opposed to indicating how long the electronic device 20 may be operated before the battery cell 22 must be recharged. However, in some embodiments the battery life sensor 26 can give an indication both of the present charge state of the battery cell 22 and the accumulated a total discharge over the lifetime of the battery cell 22.

Figure 2:
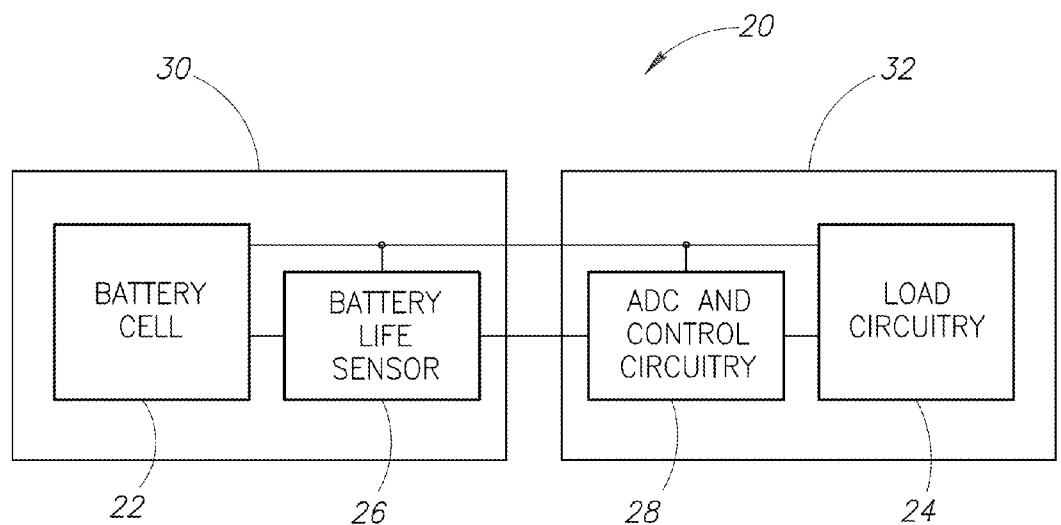
FIG. 2 is a block diagram of an electronic device 20 including a smart battery according to one embodiment.

FIG. 2 discloses an electronic device 20 according to one embodiment. The electronic device 20 includes a smart battery 30 and a circuit board 32. The smart battery 30 includes a battery cell 22 and a battery life sensor 26. The circuit board 32 includes load circuitry 24 and the analog-to-digital converter 28.

In one embodiment, the circuit board 32 is the motherboard of the electronic device 20. Electronic devices such as smartphones, tablets, laptops, and other devices commonly include a motherboard to which are attached multiple circuit components such as microcontrollers, analog-to-digital converters, wireless transceiver circuitry, memory circuits, and many other types of circuit components. The motherboard typically includes signal traces and routing lines that connect the electronic components to each other and to power source. These electronic components are the load circuitry 24.

The smart battery 30 is coupled to the circuit board 32 in order to provide power to the load circuitry 24. The smart battery 30 includes battery cell 22 and battery life sensor 26 packaged as a single component which can be coupled to or installed in the circuit board 20. As shown in FIG. 2, the smart battery 30 can also include control circuitry which can monitor the current charge state of the battery and can provide data to the load circuitry 24.

As described previously, the battery life sensor 26 measures the accumulated discharge from the battery cell 22 over the life of the battery cell 22. Thus, when the battery cell 22 provides a load current to the load circuitry 24, a sensor current is provided to the battery life sensor 26. In one embodiment, the battery life sensor measures the total sensor current provided to the battery life sensor, which gives an indication of the total discharge from the battery cell 22 as described previously.

The battery life sensor 26 outputs a signal to the analog-to-digital converter 28. The analog-to-digital converter 28 converts the signal from the battery life sensor 26 to a digital signal. The digital signal is processed by control circuitry. The control circuitry provides an estimation or calculation of the remaining battery life of the battery cell 22 as described previously.

While the circuit board 32 is shown as a single component in FIG. 2, in practice the circuit board 32 can include multiple circuit boards housed in the electronic device 20. The analog-to-digital converter 28 can be included in the load circuitry 24.

Alternatively, the analog-to-digital converter 28 can be included in the smart battery 30. Control circuitry which processes the digital signal from the analog-to-digital converter 28 can also be housed in the smart battery 30. In one embodiment, the battery life sensor 26 and the analog-to-digital converter 28 are housed in a single integrated circuit package.

Figure 3A:
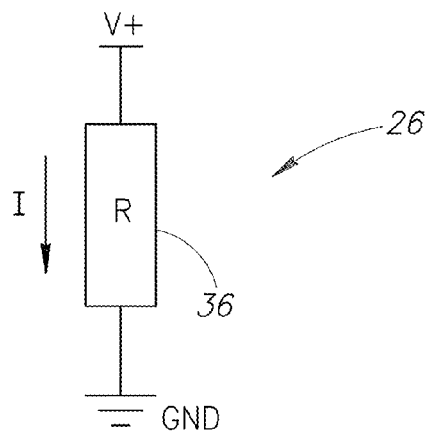
FIG. 3A is an illustration of a battery life sensor according to one embodiment.

FIG. 3A discloses a battery life sensor 26 according to one embodiment. The battery life sensor 26 includes an adjustable resistor 36. The adjustable resistor 36 is coupled between a first voltage supply node V+ and a second voltage supply node, ground.

A current I passes through the adjustable resistor 36. When the current I passes through the adjustable resistor 36, the resistance R of the adjustable resistor is permanently altered based on the amount of current that passes through it.

When the battery life sensor 26 is coupled to a battery cell 22, as described previously in relation to FIGS. 1 and 2, the battery life sensor 26 can measure the total discharge from the battery cell 22. In particular, when the battery cell 22 provides a load current to a load 24, a sensor current is passed to the battery life sensor 26. The sensor current is proportional to the load current in a known way.

The current I in FIG. 3A represents the sensor current, or a portion thereof, flowing through the adjustable resistor 36. As described previously, as current passes through the adjustable resistor 36 the resistance R of the adjustable resistor 36 is permanently altered based on the amount of current. As current continues to pass through the adjustable resistor 36, the resistance R continues to permanently change. Therefore, the total resistance R of the resistor 36 is an indication of the total current that has flowed through the adjustable resistor 36.

The adjustable resistor 36 can be formed by a thin film deposition of a resistive metal or other resistive material. The adjustable thin film resistor 36 can be formed in an integrated circuit die using techniques common to those used to form thin film resistors in an integrated circuit die. The adjustable resistor 36 can be formed with an integrated circuit die including a silicon substrate. The adjustable resistor 36 can be formed on a dielectric layer overlying the silicon substrate.

In a preferred embodiment, the adjustable thin film resistor 36 is formed by a blanket physical vapor deposition (PVD) process, for example sputtering. However, other processes are available for forming the thin film resistor, including evaporation and other suitable thin film processes.

Numerous resistive materials may be utilized to form the adjustable resistor 36, including, but not limited to, metallic films like chromium silicon, nickel chromium, tantalum nitride, tantalum aluminum, and titanium nitride. These materials have better performance than conventional polysilicon resistors because they can form a wide range of sheet resistances, they have good tolerance, are easily reproducible, have low temperature coefficients of resistance, linear behavior, and low parasitic capacitance values.

In one embodiment, the thin film resistor 34 is formed of chromium silicon between 5 and 15 nm thick. The thin film resistor 34 may comprise a single layer of chromium silicon, or multiple layers of chromium silicon having differing concentrations of silicon.

Pure silicon may also be used for the resistor 36. For example, the silicon can be polysilicon, an amorphous silicon, or other form of silicon as deposited.

In one embodiment, the adjustable resistor 36 has a low temperature coefficient of resistance over the range of temperatures at which the integrated circuit is likely to operate but may undergo a permanent change in resistance when the resistor 36 is heated by passing therethrough. This change in resistance will be a permanent change, because upon cooling the resistor after a heating cycle, the resistance will be a new value, or a semi-permanent change, because the resistance is altered from the value of resistance prior to the heating cycle. As current continues to flow through the adjustable resistor 36, the resistance continues to permanently change.

In one embodiment, a layer of chromium silicon alloy is used for the adjustable resistor 36. The resistivity, measured as sheet resistance, of the chromium silicon varies based on the percentage of silicon in the chromium silicon alloy. In one embodiment the adjustable resistor 34 is about 40% silicon and has a sheet resistance of 10 kΩ/sq for a thickness of 15 nm. An adjustable resistor 34 of 10 sq has a resistance of about 100 kΩ in the unaltered state. Since the size in squares is not a term of absolute size, but of proportion of the width and length of the resistor, the size of the adjustable resistor can be scaled to a desired value.

In one embodiment, the chromium silicon thin film adjustable resistor 36 has a temperature coefficient of resistance that is very small; in one case substantially 0%/° C. over a temperature range of normal integrated circuit operation of 0° C. to 100° C. The temperature coefficient of resistance describes the percentage change in resistance per degree change in temperature. A smaller temperature coefficient of resistance means that the resistance changes very little with changes in temperature. The temperature coefficient of resistance of a chromium silicon thin film can be adjusted by altering the percentage of silicon in the chromium silicon alloy and by forming the adjustable resistor 36 from multiple layers of chromium silicon. Thus, advantageously, the resistance of the adjustable resistor 36 changes very little with temperature in the normal operating temperature range, but can be permanently or semi-permanently altered by raising the temperature of the adjustable resistor 36 substantially higher than the normal operating temperature then cooling it again.

While the adjustable resistor 36 has been described as made from chromium silicon and having a certain thickness, the adjustable resistor can be made from any suitable material whose resistance will permanently change when a current is passed therethrough. The thickness and dimensions of the adjustable resistor 36 can be different than those described above, as will be apparent to those of skill in the art in light of the present disclosure.

Figure 3B:
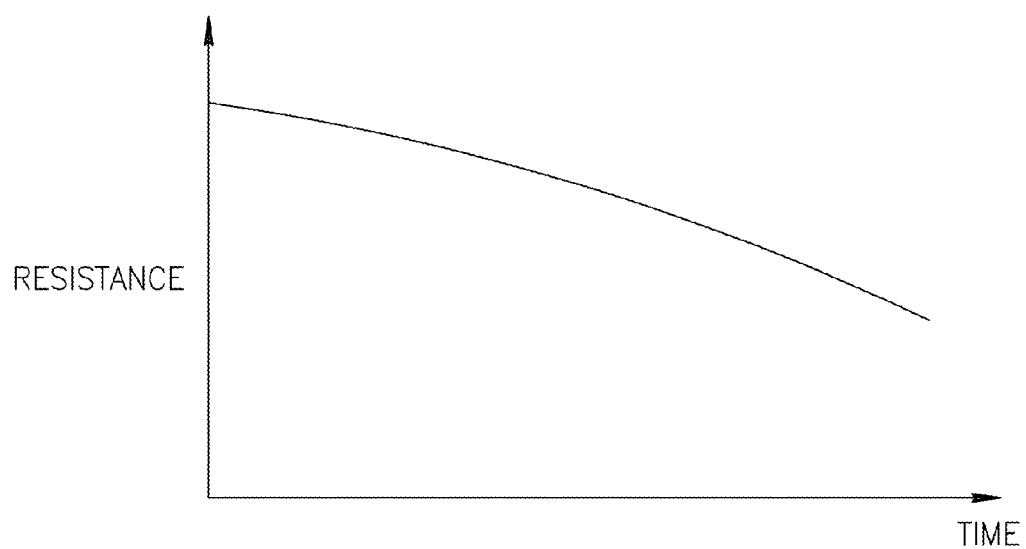
FIG. 3B is a graph of the resistance of an adjustable resistor versus time that a current flows through the resistor according to one embodiment.

FIG. 3B is a graph showing the resistance of the adjustable resistor 36 versus time as a current I is passed therethrough for a chromium silicon resistor of the type described. As can be seen from the graph in FIG. 3B, as a current is passed through the adjustable resistor 36, the resistance of the adjustable resistor 36 permanently changes. As the current continues to flow through the adjustable resistor 36, the resistance continues to change. The change in resistance is generally proportional to the amount of current, but it is not strictly linear since the response of the chromium silicon material is not linear. In the example shown in FIG. 3B, the resistance is gradually smaller. However, for other adjustable resistors 36, the resistance may increase over time as a current I is passed therethrough.

In one example, the initial resistance of the resistor 36 is about 10 kΩ. After several months of continuous use, the resistance of the resistor 36 may fall to about 7 kΩ. Of course, the rate of change of the resistor 36 can be different depending on the materials and dimensions of the resistor 36, as well as the magnitude of the current I. In another embodiment, the resistance is overlooked to reduce the current used for sensing.

Figure 4:
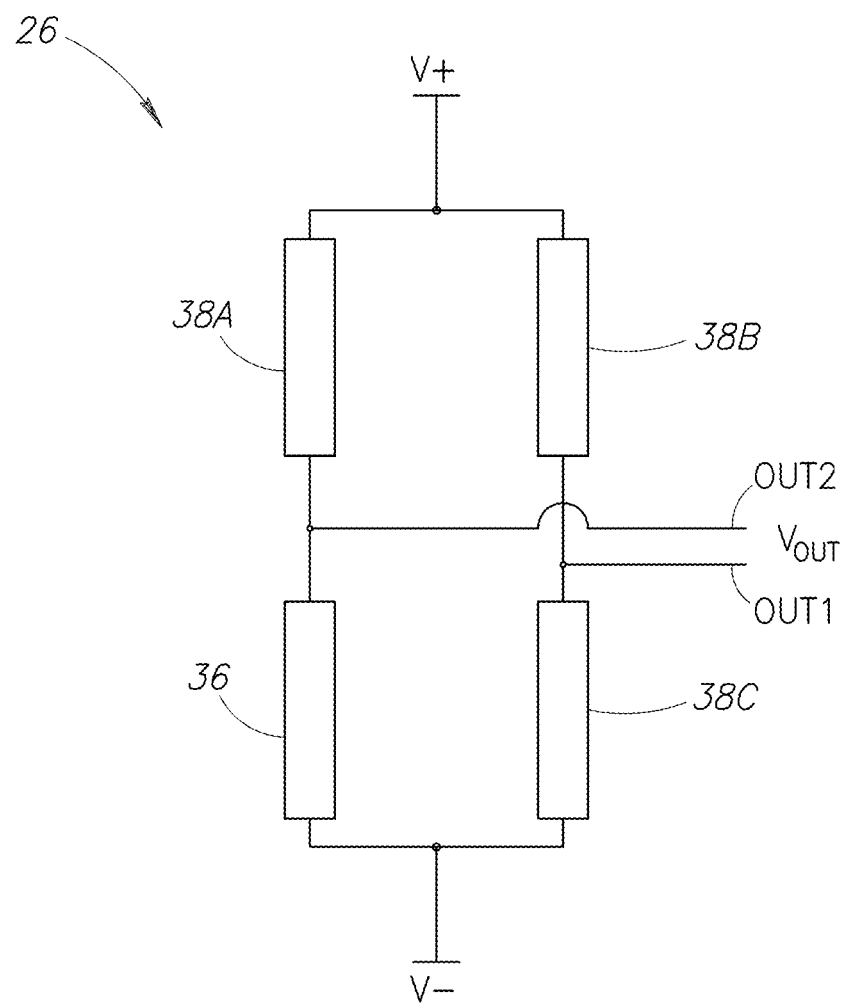
FIG. 4 is a schematic diagram of a battery life sensor according to one embodiment.

FIG. 4 is a schematic diagram of a battery life sensor 26 according to one embodiment. The battery life sensor 26 includes an adjustable resistor 36, coupled to resistors 38A-C in the Wheatstone bridge configuration. The resistors 36 and 38A-C are coupled between two supply voltage nodes V+ and V−. The battery life sensor 26 includes Wheatstone bridge outputs OUT1 and OUT2. The voltage between outputs OUT1 and OUT2 is analog output voltage Vout.

The battery life sensor 26 is can be coupled to a battery cell 22, as described previously, and placed in an electronic device 20, as described previously. When the battery cell 22 passes a load current to load circuitry 24, a sensor current is passed to the battery life sensor 26. This sensor current passes from node V+ through the resistors of the Wheatstone bridge, to the node V−.

In one embodiment, before the sensor current has passed through the battery life sensor 26, the resistors 36 and 38A-C all have the same resistance. If the resistors 36 and 38A-C all have the same resistance, then the output signal at Vout will be 0V. As the sensor current flows through the resistors 36 and 38A-C, the resistance of the adjustable resistor 36 changes. As the resistance of the adjustable resistor 36 changes, the bridge becomes unbalanced. The output voltage at Vout increases in magnitude as the bridge becomes more and more unbalanced. Thus, over the lifetime of the battery cell 22, the adjustable resistor 36 will continue to change and the output signal and Vout will continue to increase. The output signal therefore gives an indication of the total discharge from the battery cell 22 over the lifetime of the battery cell 22.

As described previously, the output signal can be passed to an analog-to-digital converter 28. The analog-to-digital converter 28 can convert the output signal to a digital signal. The digital signal can then be processed and the remaining lifetime of the battery cell 22 can be estimated, calculated, or predicted.

In one embodiment, each of the resistors 36 and 38A-C has an initial resistance of 10 kΩ. As the center current passes through the battery life sensor 26, the resistance of the adjustable resistor 36 will permanently change and thus will no longer be 10 kΩ. Of course, other values of resistance can be selected for the resistors 36 and 38A-C. Likewise, other circuit configurations can be utilized in accordance with principles of the present disclosure.

Alternatively, the battery life sensor 26 can include two Wheatstone bridge circuits each having outputs connected to the analog-to-digital converter 28. The first Wheatstone bridge can include adjustable resistor 36 and control resistors 38A-C. The second Wheatstone bridge circuit can include four control resistors without the adjustable resistor 36. In this case the second Wheatstone bridge is a reference Wheatstone bridge that provides a reference output against which the output of the first Wheatstone bridge circuit can be compared.

Figure 5:
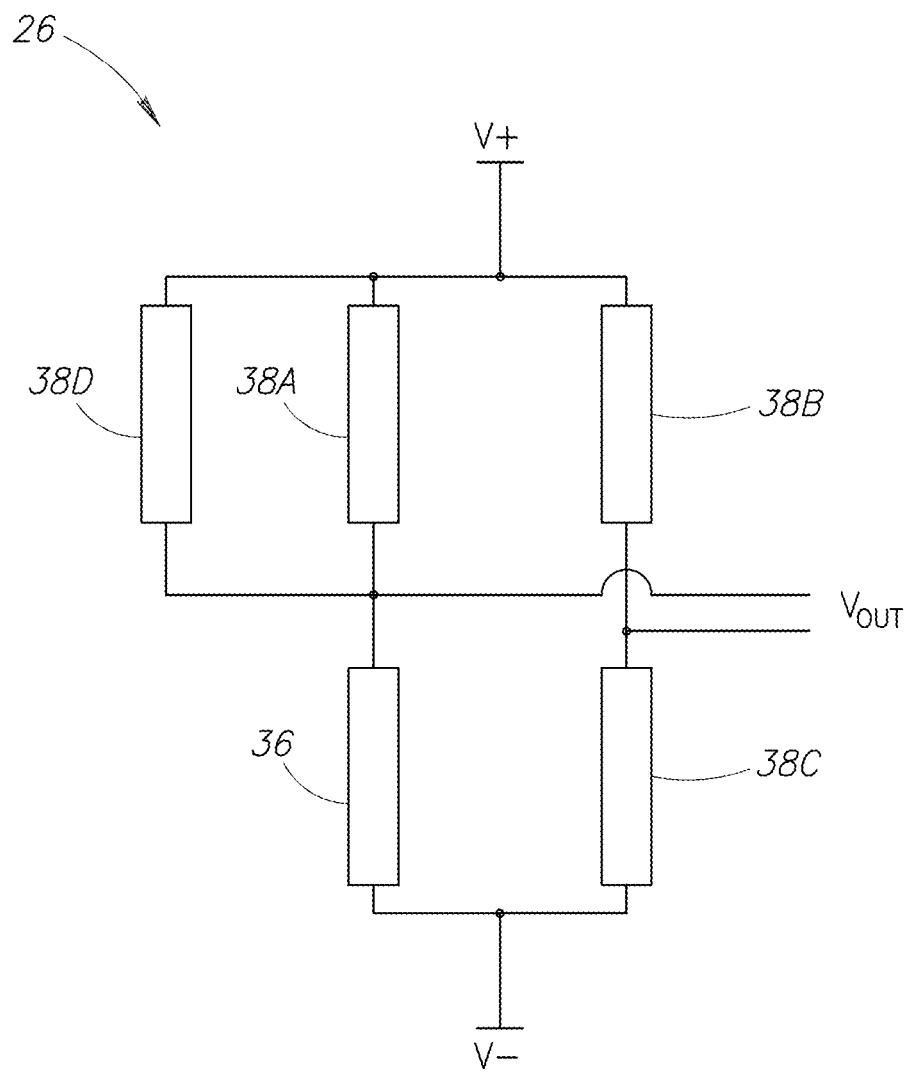
FIG. 5 is a schematic diagram of a battery life sensor according to an alternative embodiment.

FIG. 5 is a schematic diagram of a battery life sensor 26 according to one embodiment. The battery life sensor 26 includes resistors 36 and 38A-C as described in relation to FIG. 4. The battery life sensor 26 further includes resistor 38D. The resistor 38D is a balancing resistor. During manufacture of the resistors 36 and 38A-C, it is possible that the adjustable resistor 36 will have a different value than the resistors 38A-C. To account for the difficulty in making the resistor 36 the same as resistors 38A-C, the balancing resistor 38D can be included in order to balance the bridge. For example, if during manufacture it is found that the chromium silicon resistor 36 is routinely around 9 kΩ, then balancing resistor 38D can be included during manufacture. The balancing resistor 38D can be manufactured to have a value which balances the bridge initially. The adding of balance resistor 38D is one example of a hardware calibration. Alternatively, the value Vout can be sensed right after manufacture and if Vout is not zero then the memory can store an offset value to subtract from Vout to bring it to zero and this can be used to calibrate the initial circuit. Other software or hardware techniques can be used to calibrate the sensor 26 before the first use. In any case, through testing and calibration of the battery life sensor, the output of the battery life sensor 26 can be correlated to accurate values of the remaining battery life of the battery cell 22.

Figure 6:
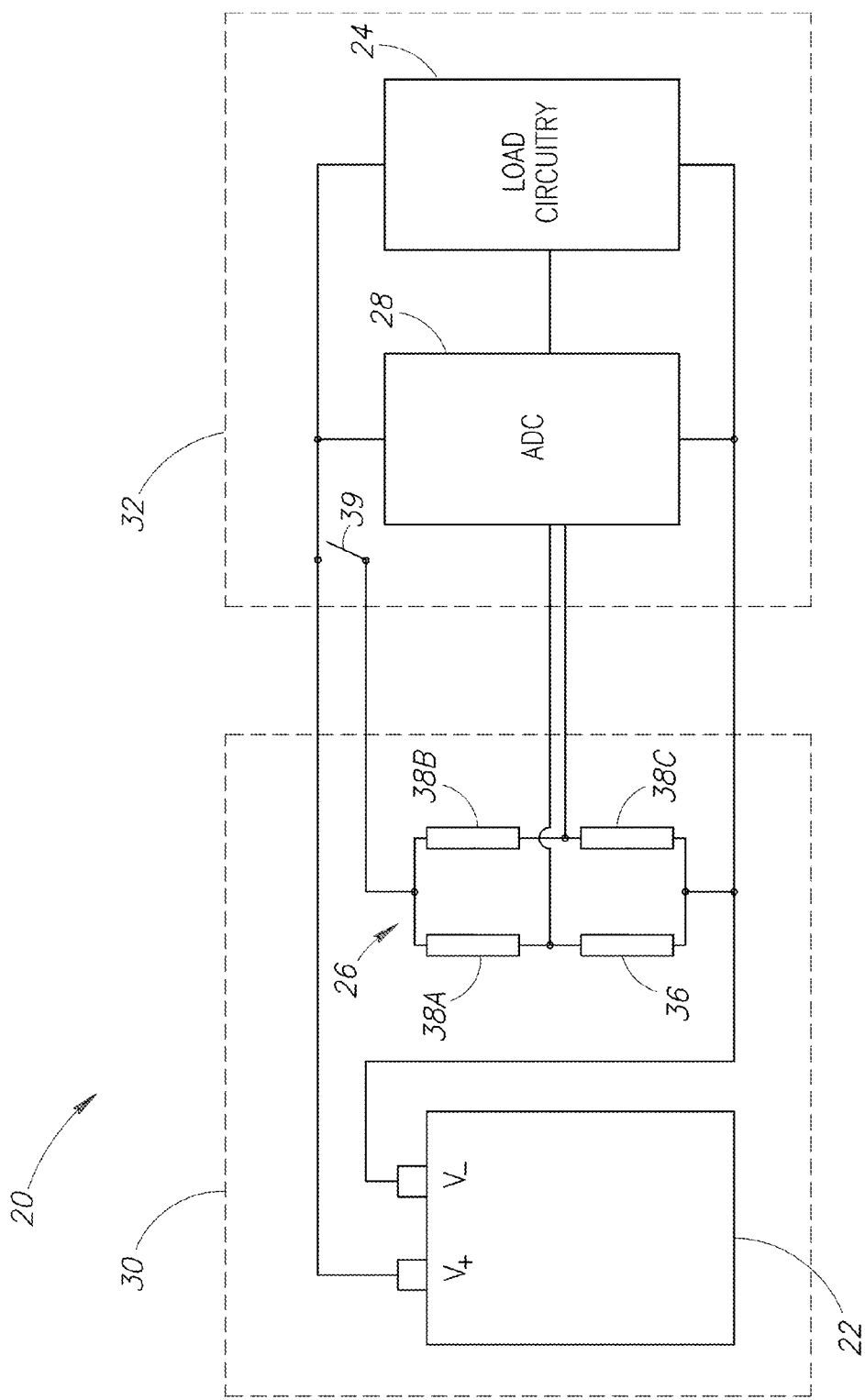
FIG. 6 is a block diagram of a battery life sensor and electronic device according to one embodiment.

FIG. 6 illustrates an electronic device 20 according to one embodiment. The electronic device 20 includes a smart battery 30 coupled to a circuit board 32. The smart battery 30 includes a battery cell 22 having two terminals V+ and V− which supply power to the load circuitry 24 as described previously. The smart battery 30 includes a battery life sensor 26 having resistors 36 and 38A-C configured in a Wheatstone bridge configuration, as described previously in relation to FIG. 4. The circuit board 32 includes a switch 39. When power is supplied to the load circuitry 24, the switch 39 is closed and power is also supplied to the battery life sensor 26. Alternatively, the switch 39 can be included in the smart battery 30.

As current passes through the battery life sensor 26, the resistance of the adjustable resistor 36 permanently changes as described previously. The analog-to-digital converter 28 receives the output from the battery life sensor 26 and converts it to a digital value. Control circuitry, either included in the analog-to-digital converter 28 or the load circuitry 24, processes the digital value and estimates or calculates the remaining battery life.

Figure 7:
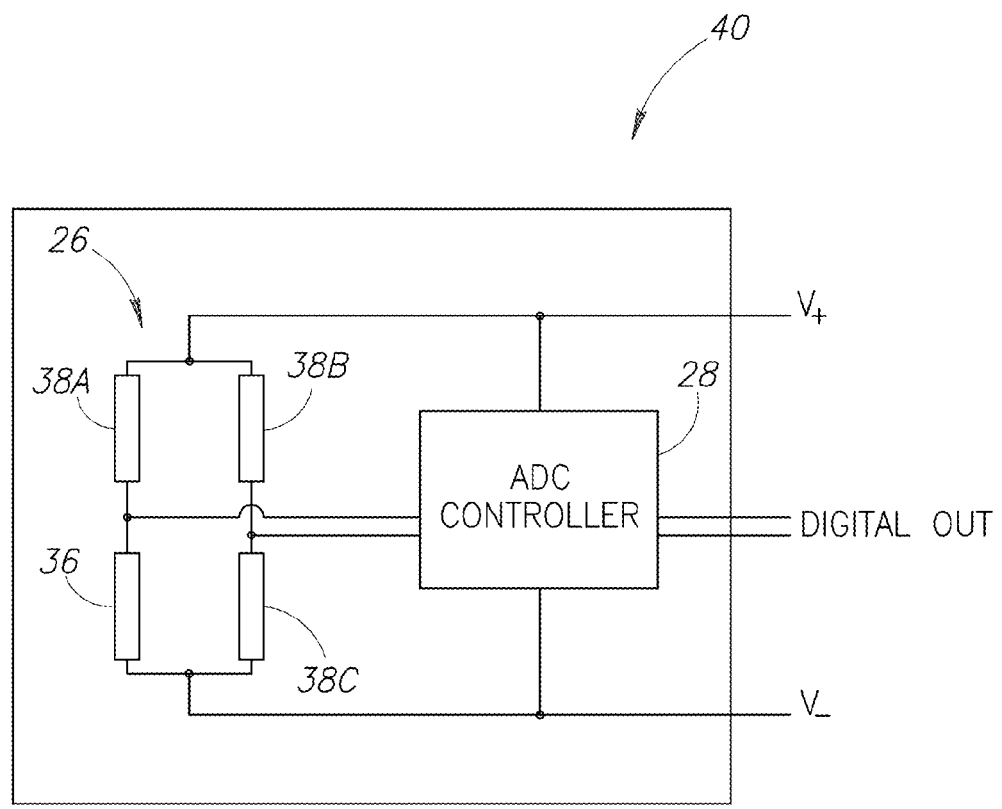
FIG. 7 is a block diagram of a sensor module according to one embodiment.

FIG. 7 illustrates an integrated circuit package 40 according to one embodiment. The integrated circuit package 40 includes the battery life sensor 26 and the analog-to-digital converter 28 in a single integrated circuit die. Integrated circuit package 40 includes power supply inputs V+ and V− by which power supplied to the analog-to-digital converter 28 and the battery life sensor 26. The integrated circuit package 40 includes digital outputs from the analog-to-digital converter 28. The integrated circuit package 40 of FIG. 7 can be included in the smart battery 30 or on the circuit board 32. The analog-to-digital controller 28 can further include microcontroller circuitry.

Figure 8:
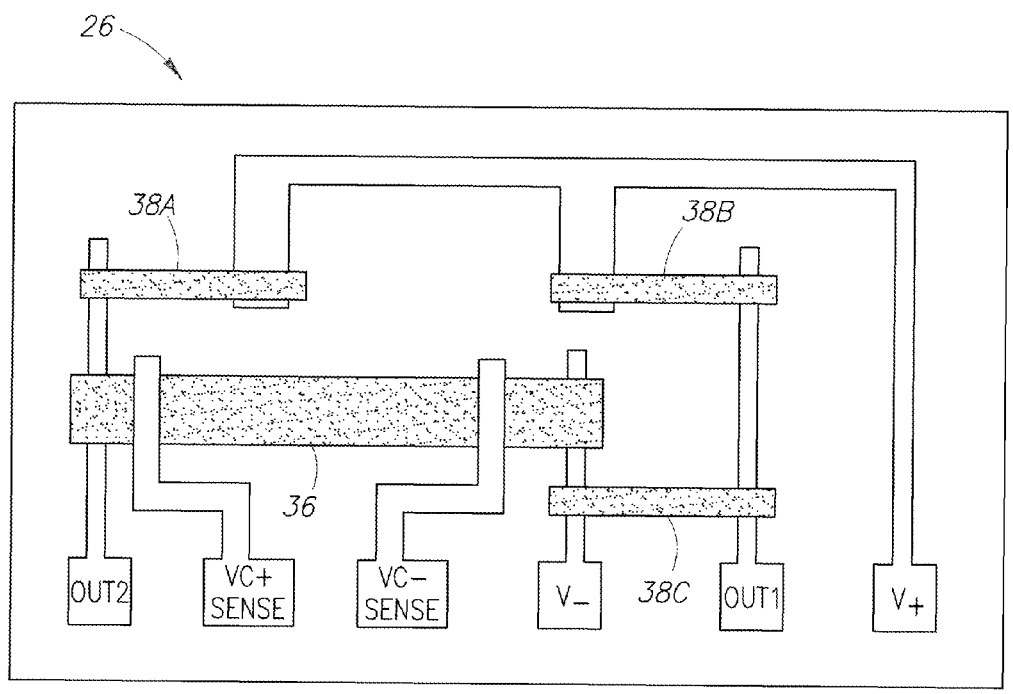
FIG. 8 is a top view of a battery life sensor according to one embodiment.

FIG. 8 is a top view of the layout of battery life sensor 26 according to one embodiment. Battery life sensor 26 includes resistors 36 and 38A-C formed on a substrate. The adjustable resistor 36 is, for example, chromium silicon and resistor. The resistors 38A-C are, for example, TaAl.

For clarity, only the resistor layers and metal connections are shown in FIG. 8. An example process includes starting with a wafer of semiconductor material such as silicon, or a dielectric material such as glass. A dielectric layer such as silicon dioxide is grown on the wafer and then scribe lines are etched in the wafer. Next, metal interconnect lines are formed by depositing and etching a metal layer such as AlSiCu, AlSi, or AlCu. The chromium silicon adjustable resistor 36 is formed by depositing and etching a layer of chromium silicon. Next, the resistors 38A-C are formed by depositing and etching TaAl. A passivation layer of silicon nitride is then deposited. The silicon nitride layer is etched to expose portions of the metal interconnections. A metal layer is then deposited and etched to form the pads OUT2, VC SENSE, V−, OUT1, and V+ in electrical connection with the metal interconnections. In the embodiment shown in FIG. 8, two extra terminals are provided, VC− sense and VC+ sense. Providing these two VC− sense and VC+ sense terminals permits the sense resistor 36 to be probed directly for calibration sensing, to check battery life directly or for some other purpose.

Figure 9:
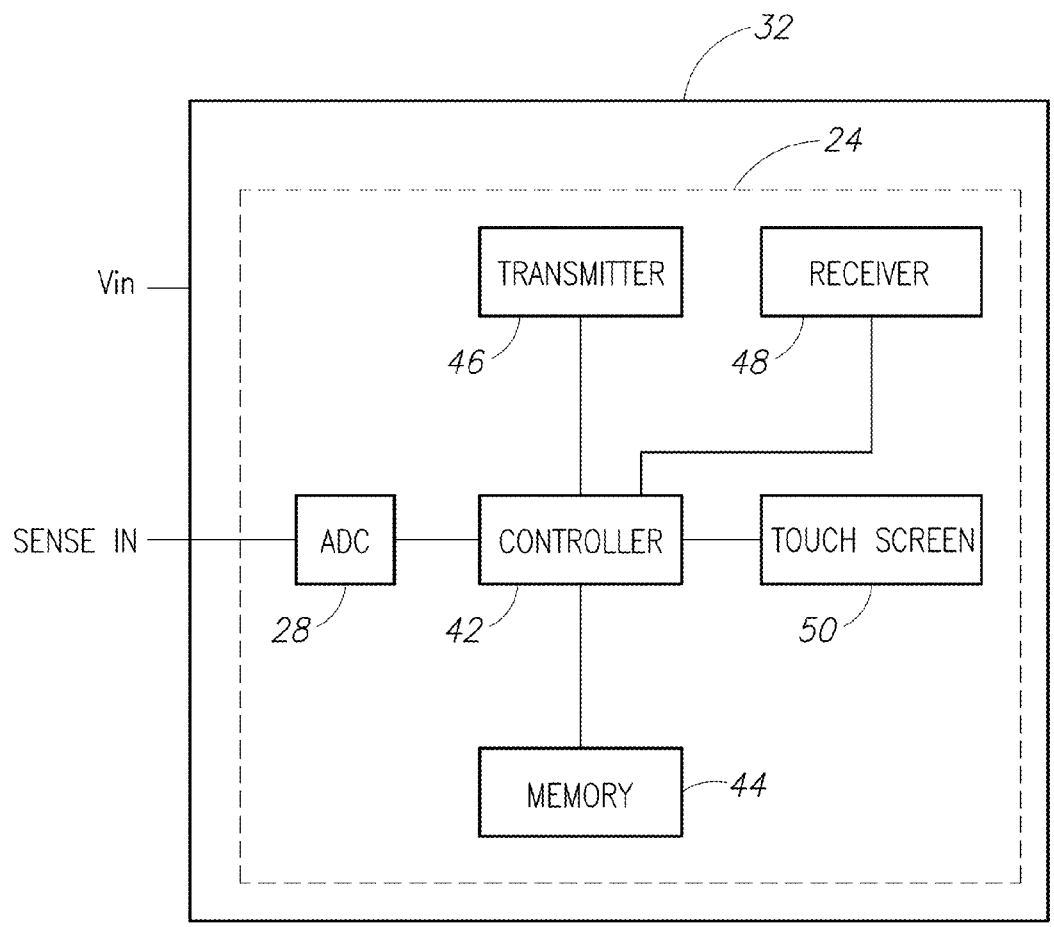
FIG. 9 is a block diagram of an electronic device according to one embodiment.

FIG. 9 is a block diagram of the circuit board 32 of an electronic device 20. Circuit board 32 includes a load circuitry 24. The load circuitry 24 includes an analog-to-digital converter 28 coupled to a sensing input by which the analog-to-digital converter 28 receives an output signal from the battery life sensor 26. The load circuitry further includes a controller 42 coupled to the analog-to-digital converter 28. The controller 42 can process the output of the analog-to-digital converter 28. The controller 42 can also control the other components of the load circuitry 24. The controller 42 is further coupled to a memory 44. The memory 44 can store software data for estimating or calculating the remaining battery life as described previously. The memory 44 can also store other software instructions and data for the operation of the electronic device 20. The controller 42 reads from the memory 44 and executes instructions. A transmitter 46 and receiver 48 are also coupled to the controller 42. The transmitter 46 and receiver 48 transmit and receive wireless signals, respectively. The transmitter 46 and receiver 48 include circuitry to communicate with wireless Internet networks cellular networks or other wireless communications. The load circuitry further includes a touchscreen 50 coupled to the controller 42. The controller 42 can operate the touchscreen 50 to both display images and respond to user touch. The circuit board 32 can, of course, include many other components and configurations not shown in FIG. 9.

Figure 10:
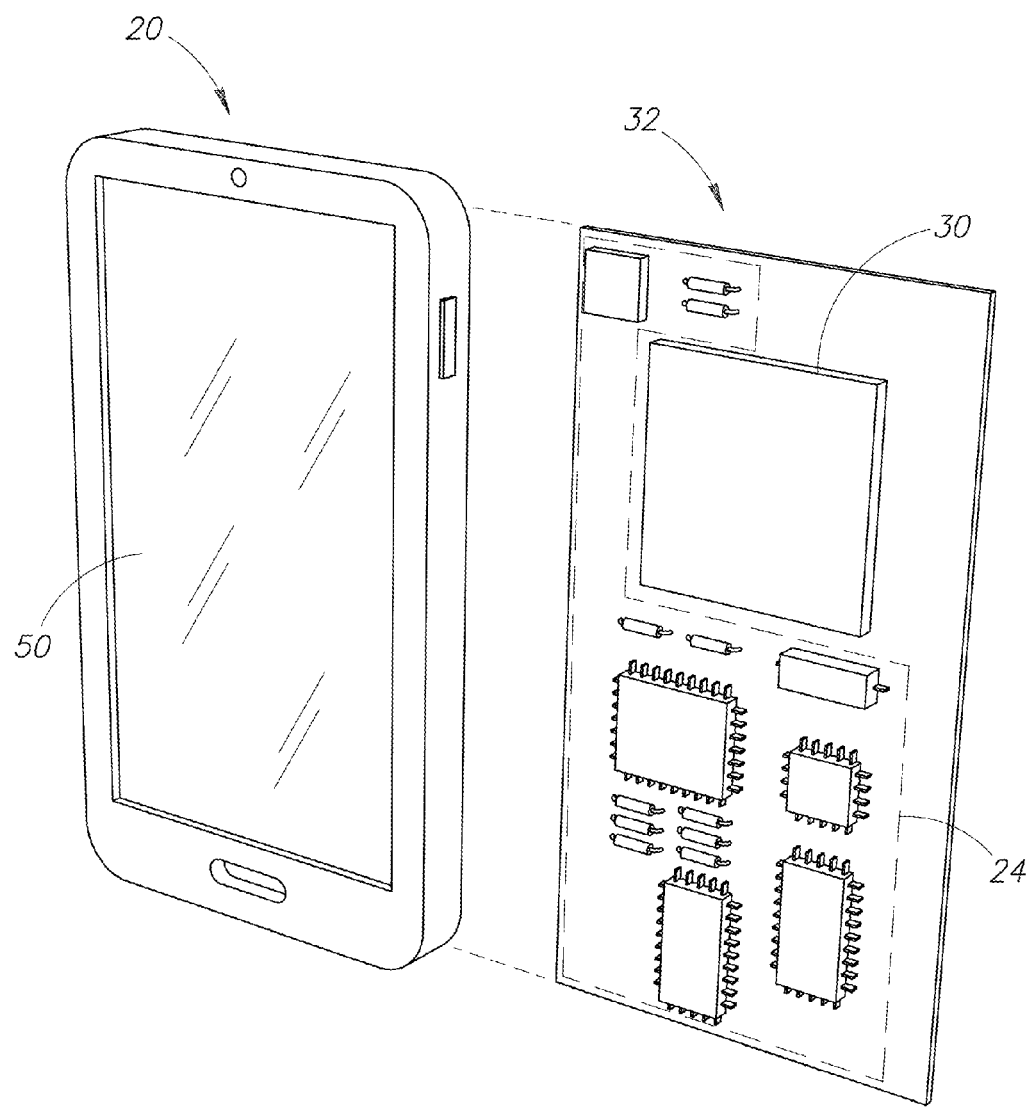
FIG. 10 is an isometric view of a smart phone that makes use of the inventive battery sensor.

FIG. 10 is an illustration of a smartphone 20 according to one embodiment. The smartphone 20 includes a touchscreen 50 and a circuit board 32 as described previously. The circuit board 32 includes a load circuitry 24. The load circuitry 24 includes multiple integrated circuit packages resistors and capacitors transceivers and receivers for performing the functions of the smartphone and calculating the remaining battery life as described previously. The smart battery 30 includes a battery cell 22 and a battery life sensor 26. The smart battery 30 can also include analog-to-digital converter 28 and control circuitry as described previously. The circuit board 32 can include many other components and different configurations than those shown in relation to FIG. 10. The illustration of FIG. 10 is given only by way of example and is not limiting.

Embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
   a first power supply node;
   a second power supply node; and
   a sensor coupled between the first and second power supply nodes and configured to output a signal indicative of a total power dissipation through a load, the sensor including:
   an adjustable resistor having a resistance that permanently changes as the adjustable resistor dissipates power, the adjustable resistor being configured to dissipate a first power proportional to a second power dissipated through the load, the resistance of the adjustable resistor being indicative of the total power dissipated through the load; and
   an output coupled to the adjustable resistor and configured to output the indication of the total power dissipation through the load.

2. The electronic device of claim 1 comprising a rechargeable battery coupled to the first and second power supply nodes and configured to supply a load current to the load and a sensor current to the sensor, the sensor current being proportional to the load current.

3. The electronic device of claim 2 wherein the signal output by the sensor is indicative of a remaining lifetime of the rechargeable battery.

4. The electronic device of claim 2 comprising a switch coupled to the first power supply node and configured to supply the sensor current to the sensor when the battery supplies the load current to the load and to prevent the sensor from receiving the first current when the battery does not supply the load current to the load.

5. The electronic device of claim 2 comprising an analog-to-digital converter configured to receive the signal from the sensor and to convert it to a digital signal.

6. The electronic device of claim 5 comprising control circuitry coupled to the analog-to-digital receiver and configured to receive the digital signal and to estimate a remaining total battery life of the battery based on the digital signal.

7. The electronic device of claim 6 including:
a transmitter coupled to the control circuitry and configured to transmit wireless signals; and
a receiver coupled to the control circuitry and configured to receive wireless signals, wherein the analog-to-digital converter, the control circuitry, the transmitter, and the receiver each receive respective portions of the load current.

8. The electronic device of claim 1 comprising load circuitry coupled to the first power supply node and to receive a load current from the first power supply node, the load circuitry including:
an analog-to-digital converter configured to receive the signal from the sensor and to convert the signal to a digital signal; and
control circuitry coupled to the analog-to-digital converter and configured to receive the digital signal from the analog-to-digital converter.

9. The electronic device of claim 8 wherein the control circuitry is configured to output an estimated remaining lifetime of the load circuitry based on the digital signal.

10. The electronic device of claim 8 comprising a switch coupled to the control circuitry and the first power supply node, the control circuitry being configured to allow a sensor current to pass to the sensor when load current flows through the load circuitry by controlling the switch.

11. An electronic device, comprising:
a sensor coupled between a first power supply node and a second power supply node and configured to output a signal indicative of a total power dissipation through a load, the sensor including:
an adjustable resistor having a resistance that permanently changes as the adjustable resistor dissipates power, the adjustable resistor being configured to dissipate a first power proportional to a second power dissipated through the load, the resistance of the adjustable resistor being indicative of the total power dissipated through the load; and
an output coupled to the adjustable resistor and configured to output the indication of the total power dissipation through the load.

12. The electronic device of claim 11 comprising:
the first power supply node; and
the second power supply node.

13. The electronic device of claim 12 comprising a rechargeable battery coupled to the first and second power supply nodes and configured to supply a load current to the load and a sensor current to the sensor, the sensor current being proportional to the load current.

14. The electronic device of claim 13 wherein the signal output by the sensor is indicative of a remaining lifetime of the rechargeable battery.

15. The electronic device of claim 14 comprising a switch coupled to the first power supply node and configured to supply the sensor current to the sensor when the battery supplies the load current to the load and to prevent the sensor from receiving the first current when the battery does not supply the load current to the load.

16. The electronic device of claim 15 comprising an analog-to-digital converter configured to receive the signal from the sensor and to convert it to a digital signal.

17. The electronic device of claim 16 comprising control circuitry coupled to the analog-to-digital receiver and configured to receive the digital signal and to estimate a remaining total battery life of the battery based on the digital signal.

18. The electronic device of claim 17 including:
a transmitter coupled to the control circuitry and configured to transmit wireless signals; and
a receiver coupled to the control circuitry and configured to receive wireless signals, wherein the analog-to-digital converter, the control circuitry, the transmitter, and the receiver each receive respective portions of the load current.

19. The electronic device of claim 12 comprising load circuitry coupled to the first power supply node and to receive a load current from the first power supply node, the load circuitry including:
an analog-to-digital converter configured to receive the signal from the sensor and to convert the signal to a digital signal; and
control circuitry coupled to the analog-to-digital converter and configured to receive the digital signal from the analog-to-digital converter.

20. The electronic device of claim 19 wherein the control circuitry is configured to output an estimated remaining lifetime of the load circuitry based on the digital signal.

21. The electronic device of claim 20 comprising a switch coupled to the control circuitry and the first power supply node, the control circuitry being configured to allow a sensor current to pass to the sensor when load current flows through the load circuitry by controlling the switch.

* * * * *